Dec. 28, 1971 TOMEJI OHNO ET AL 3,630,907

PIEZOELECTRIC CERAMICS

Filed July 10, 1969 2 Sheets-Sheet 1

INVENTORS

TOMEJI OHNO
MASAO TAKAHASHI
TSUNEO AKASHI
NORIO TSUBOUCHI

BY Sandoe, Hopgood and Calimafde
ATTORNEYS

INVENTORS
TOMEJI OHNO
MASAO TAKAHASHI
TSUNEO AKASHI
NORIO TSUBOUCHI

BY
Sandoe, Hopgood and Calimafde
ATTORNEYS

United States Patent Office 3,630,907

Patented Dec. 28, 1971

3,630,907
PIEZOELECTRIC CERAMICS

Tomeji Ohno, Masao Takahashi, Tsuneo Akashi, and Norio Tsubouchi, Tokyo, Japan, assignors to Nippon Electric Company, Limited, Minato-ku, Tokyo, Japan Continuation-in-part of application Ser. No. 681,494, Nov. 8, 1967. This application July 10, 1969, Ser. No. 840,788
Claims priority, application Japan, July 12, 1968, 43/49,407
The portion of the term of the patent subsequent to July 27, 1988, has been disclaimed
Int. Cl. C04b *35/46, 35/48*
U.S. Cl. 252—62.9 3 Claims

ABSTRACT OF THE DISCLOSURE

Piezoelectric ceramics are provided consisting essentially of a solid solution of $Pb(Li_{1/4}Sb_{3/4})O_3$, $PbTiO_3$ and $PbZrO_3$ where up to 25 atom percent of Pb may be replaced by at least one of Ba, Sr and Ca, and manganese oxide in the amount of 0.10 to 3.0 weight percent in the form of MnO.

This application is a continuation-in-part of U.S. application Ser. No. 681,494, filed Nov. 8, 1967, now Pat. No. 3,595,795.

This invention relates to piezoelectric materials and more particularly to piezoelectric ceramics having excellent piezoelectric properties.

BACKGROUND OF THE INVENTION

The fundamental measures for evaluating the piezoelectric properties of a piezoelectric material are the electromechanical coupling factor and the mechanical quality factor. The former is a representative of the efficiency of transforming electrical oscillation into mechanical vibration and of conversely transforming mechanical vibration into electrical oscillation. A greater elecromechanical coupling facor indicates for better efficiency of interconversion. The latter factor shows the reciprocal proportion of the energy consumed by the material during the energy conversion, larger mechanical quality factor indicating for smaller energy consumption.

One of the typical fields of application for piezoelectric materials is in the manufacture of elements for ceramic filters. In this case, it is desirable to provide an electromechanical coupling factor with an optimum value selected from a wide range between the extremely great and the very small while the mechanical quality factor should assume as large a value as possible. This fact is fully described in, for example, R. C. V. Macario, "Design Data for Band-Pass Ladder Filter Employing Ceramic Resonators" which appears in Electronic Engineering, vol. 33, No. 3, (1961) pp. 171–177.

The transducer elements of mechanical filters provide another important field of application of piezoelectric ceramics. In this case, both the electromechanical coupling factor and the mechanical quality factor should be as large as possible.

In a copending application U.S. Ser. No. 681,494 of which this application is a continuation-in-part filed by the same applicant, there is disclosed novel piezoelectric ceramics of $Pb(Li_{1/4}Sb_{3/4})O_3$-$PbTiO_3$-$PbZrO_3$. Although these ceramics have a remarkably large electromechanical coupling factor, the mechanical quality factor is low and hence the fields of application are rather restricted. They are not suited for use in the manufacture of elements for ceramic filters and transducer elements for mechanical filters.

OBJECTS OF THE INVENTION

The object of this invention is to provide piezoelectric ceramics haaing high values for both the electromechanical coupling factor and the mechanical quality factor.

Another object of this invention is to provide piezoelectric ceramics suited for use in fields such as the manufacture of elements for ceramic filters and the transducer elements of mechanical filters.

SUMMARY OF THE INVENTION

This invention is characterized by the ceramic compositions consisting essentially of a solid solution of $Pb(Li_{1/4}Sb_{3/4})O_3$—$PbTiO_3$—$PbZrO_3$ ternary system and manganese oxide ranging from 0.10 to 3.0 weight percent. The lead (Pb) contained in the basic $Pb(Li_{1/4}Sb_{3/4})O_3$-$PbZrO_3$ composition may be replaced, up to 25 atom percent thereof, by barium (Ba), strontium (Sr) or calcium (Ca).

Where the basic $Pb(Li_{1/4}Sb_{3/4})O_3$-$PbTiO_3$-$PbZrO_3$ composition is represented by the compositional formula $[Pb(Li_{1/4}Sb_{314})O_3]x[PbTiO]y[PbZdO_3]z$ where $x$, $y$, and $z$ are a set of mol ratios and $x+y+z=1.00$, the composition should be restricted within the range determined by the following combinations of the mol ratios $x$, $y$ and $z$:

| x | y | z |
|---|---|---|
| 0.01 | 0.70 | 0.29 |
| 0.01 | 0.09 | 0.90 |
| 0.05 | 0.05 | 0.90 |
| 0.30 | 0.05 | 0.65 |
| 0.30 | 0.50 | 0.20 |
| 0.10 | 0.70 | 0.20 |

Incorporation of manganese oxide (MnO) in the amount of 0.10 to 3.0 weight percent into the basic composition mentioned above improves the mechanical quality factor without fatal decrease in the electromechanical coupling factor and produces useful piezoelectric ceramics applicable to the elements of ceramic filters and the transducer elements of mechanical filters.

BRIEF DESCRIPTION OF THE DRAWINGS

The excellent piezoelectric properties of the ceramic compositions of this invention will be apparent from the following description of preferred examples as illustrated in the accompanying drawings.

In the drawings.

DETAILED DESCRIPTION

Powdered materials of lead monoxide (PbO), lithium carbonate ($Li_2CO_3$), antimony sesquioxide ($Sb_2O_3$), titanium dioxide ($TiO_2$), zironium dioxide ($ZrO_2$) and manganses carbonate ($MnCO_3$) are used as starting materials to obtain the $Pb(Li_{1/4}Sb_{3/4})O_3$-$PbTiO_3$-$PbZrO_3$ ceramics containing manganese monoxide. These powdered materials are so proportioned that the final composition may comprise various mol ratios $x$, $y$, and $z$ of the basic composition with the manganese monoxide varying in amount from 0.00 to 3.0 weight percent as shown in Table 1. Furthermore, barium carbonate (BaCO), strontium carbonate ($SrCO_3$) or calcium carbonate ($CaCO_3$) may be added to above starting materials to obtain the ceramics having compositions shown in Table 2, in which $u$ atom percent of lead (Pb) of the basic composition having the mol ratios $x$, $y$ and $z$ of the $Pb(Li_{1/4}$-$Sb_{3/4})O_3$, $PbTiO_3$ and $PbZrO_3$ components is replaced by barium (Ba), strontium (Sr) or calcium (Ca) represented by Me in the table. Lithium carbonate ($Li_2CO_3$), antimony sesquioxide ($Sb_2O_3$), manganese carbonate ($MnCO_3$), and barium, strontium or calcium carbonate ($BaCO_3$, $SrCO_3$ or $CaCO_3$) are proportioned as calculated on the basis of lithium oxide ($Li_3O$)· antimony pentoxide ($Sb_2O_5$), manganese monoxide (MnO), antimony pentoxide ($Sb_2O_5$), manganese monoxide (MnO), and barium, strontium or calcium oxide (BaO, SrO or CaO), respectively.

The respective powders are mixed in a ball mill with the ethyl alcohol. The mixed powders are then subjected to filtration, dried, crushed, then presintered at 900° C. for one hour, and again crushed. Thereafter, the mixtures, with a small amount of distilled water being added thereto, are press-molded into discs of 20 mm. in diameter at a pressure of 700 kg./cm.[2] and sintered in an atmosphere of lead monoxide (PbO) for one hour at a temperature of 1260° to 1300° C. The resulting ceramic discs are polished to a thickness of one millimeter, provided with silver electrodes on both surfaces, and thereafter piezoelectrically activated through polarization treatment for one hour at 100° C. under an applied D.C. electric field of 30 to 50 kv./cm.

After the ceramic discs stand for 24 hours, the electromechanical coupling factor for the radial mode vibration $k_r$ and the mechanical quality factor $Q_m$ may be measured to evaluate the piezoelectric properties. Measurement of these piezoelectric properties may be made in accordance with the IRE standard circuit. The value of $k_r$ is calculated by the resonant to antiresonant frequency method. The dielectric constant $\epsilon$ and the dielectric loss (tan $\delta$) are also measured at a frequency of 1 kHz.

Figure 1:
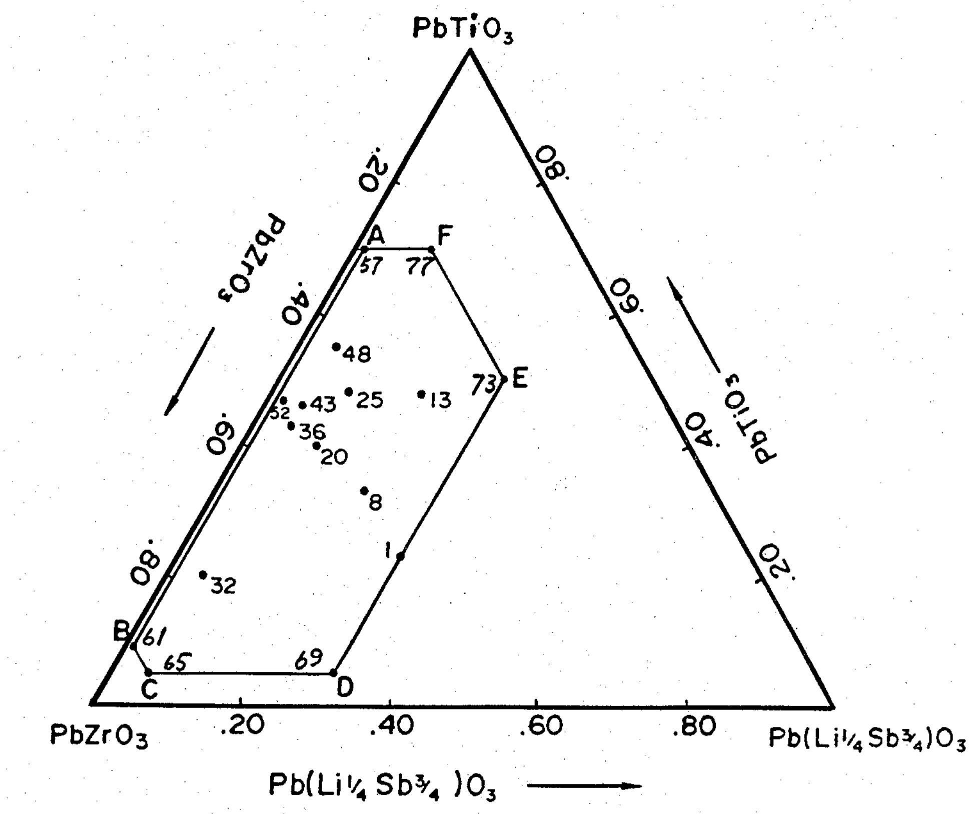
FIG. 1 is a composition diagram of the ternary system showing both the effective ranges of the basic compositions of the ceramics of this invention and particular basic compositions.
Figure 2:
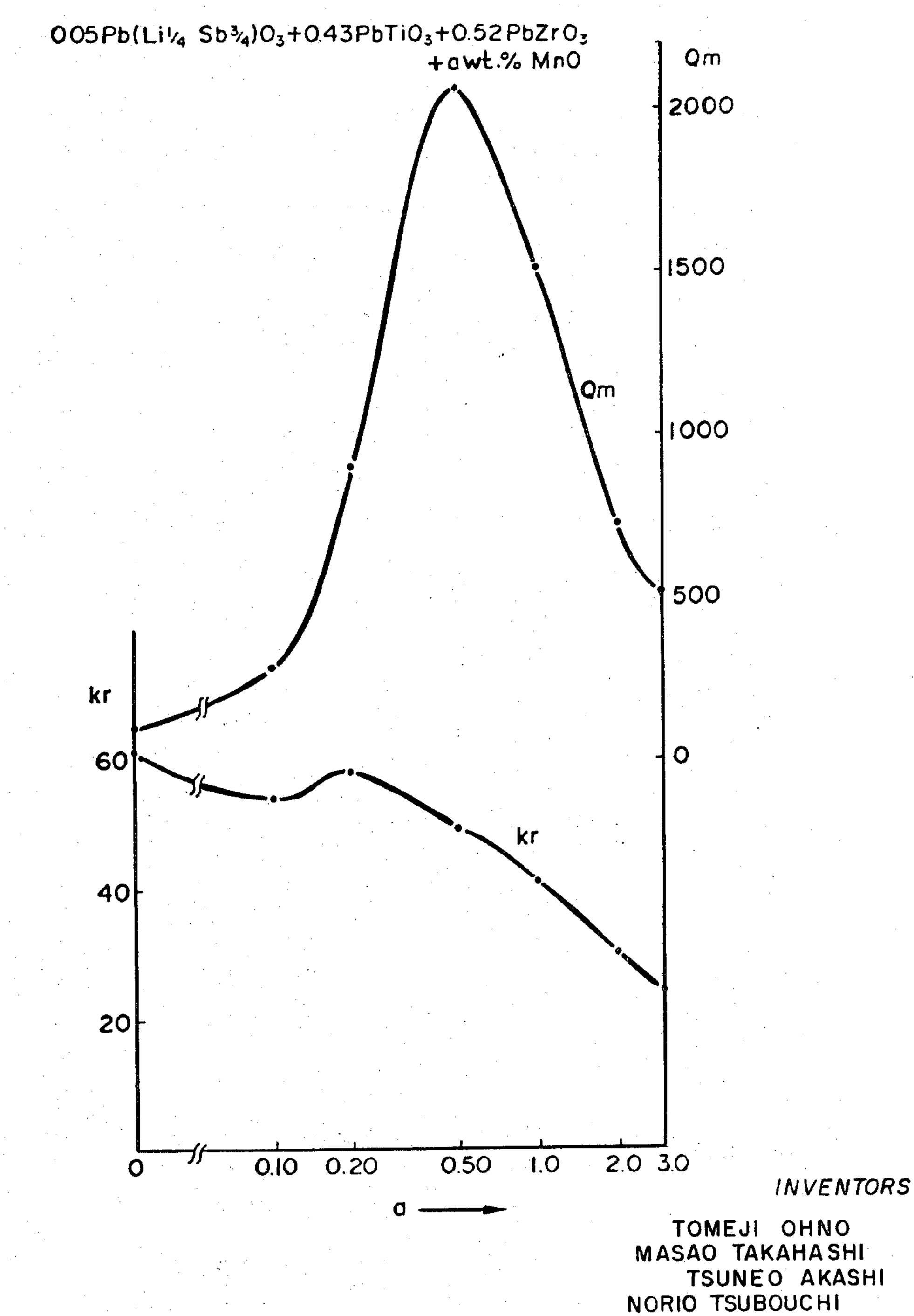
FIG. 2 illustrates graphically the electromechanical coupling factor and the mechanical quality factor of the ceramics of this invention, as a function of the amount of manganese oxide in the compositon.

Tables 1 and 2 show typical results obtained. The basic compositions of the specimens of Table 1 are shown in FIG. 1 by the points located inside the triangle.

TABLE 1

| Number | Mol ratio of basic composition: $Pb(Li_{1/4}Sb_{3/4})O_3$, $x$ | $PbTiO_3$, $y$ | $PbZrO_3$, $z$ | Additive agent, MnO (wt. percent) | $k_r$ (percent) | $Q_m$ | $\epsilon$ | Tan $\delta$ (percent) |
|---|---|---|---|---|---|---|---|---|
| 1* | 0.30 | 0.23 | 0.47 | 0.00 | 11 | 320 | 570 | 26 |
| 2 | 0.30 | 0.23 | 0.47 | 0.10 | 12 | 700 | 460 | 1.9 |
| 3 | 0.30 | 0.23 | 0.47 | 0.20 | 13 | 950 | 490 | 1.2 |
| 4 | 0.30 | 0.23 | 0.47 | 0.50 | 13 | 2,240 | 550 | 1.3 |
| 5 | 0.30 | 0.23 | 0.47 | 1.0 | 10 | 2,260 | 920 | 1.4 |
| 6 | 0.30 | 0.23 | 0.47 | 2.0 | 8 | 1,140 | 650 | 2.0 |
| 7 | 0.30 | 0.23 | 0.47 | 3.0 | 7 | 600 | 530 | 2.5 |
| 8* | 0.20 | 0.33 | 0.47 | 0.00 | 26 | 170 | 830 | 2.9 |
| 9 | 0.20 | 0.33 | 0.47 | 0.10 | 24 | 350 | 760 | 1.5 |
| 10** | 0.20 | 0.33 | 0.47 | 0.20 | 24 | 740 | 680 | 1.3 |
| 11 | 0.20 | 0.33 | 0.47 | 0.50 | 23 | 2,770 | 680 | 1.2 |
| 12 | 0.20 | 0.33 | 0.47 | 1.0 | 22 | 2,400 | 760 | 1.5 |
| 13* | 0.20 | 0.48 | 0.32 | 0.00 | 25 | 180 | 630 | 1.9 |
| 14 | 0.20 | 0.48 | 0.32 | 0.10 | 17 | 390 | 560 | 1.6 |
| 15 | 0.20 | 0.48 | 0.32 | 0.20 | 16 | 960 | 470 | 1.4 |
| 16 | 0.20 | 0.48 | 0.32 | 0.50 | 22 | 2,250 | 570 | 1.2 |
| 17 | 0.20 | 0.48 | 0.32 | 1.0 | 31 | 1,640 | 800 | 1.5 |
| 18 | 0.20 | 0.48 | 0.32 | 2.0 | 37 | 900 | 1,240 | 1.8 |
| 19 | 0.20 | 0.48 | 0.32 | 3.0 | 31 | 390 | 1,130 | 2.0 |
| 20* | 0.10 | 0.40 | 0.50 | 0.00 | 53 | 110 | 870 | 2.3 |
| 21 | 0.10 | 0.40 | 0.50 | 0.10 | 51 | 280 | 780 | 1.5 |
| 22 | 0.10 | 0.40 | 0.50 | 0.20 | 52 | 770 | 700 | 1.0 |
| 23 | 0.10 | 0.40 | 0.50 | 0.50 | 46 | 2,650 | 590 | 1.1 |
| 24 | 0.10 | 0.40 | 0.50 | 1.0 | 44 | 2,610 | 510 | 1.1 |
| 25* | 0.10 | 0.48 | 0.42 | 0.00 | 54 | 120 | 1,640 | 1.3 |
| 26 | 0.10 | 0.48 | 0.42 | 0.10 | 52 | 310 | 1,470 | 1.2 |
| 27 | 0.10 | 0.48 | 0.42 | 0.20 | 49 | 390 | 1,390 | 1.0 |
| 28 | 0.10 | 0.48 | 0.42 | 0.50 | 61 | 950 | 1,420 | 1.2 |
| 29 | 0.10 | 0.48 | 0.42 | 1.0 | 64 | 890 | 1,470 | 1.3 |
| 30 | 0.10 | 0.48 | 0.42 | 2.0 | 32 | 530 | 1,260 | 1.5 |
| 31 | 0.10 | 0.48 | 0.42 | 3.0 | 26 | 400 | 1,180 | 1.8 |
| 32* | 0.05 | 0.20 | 0.75 | 0.00 | 28 | 270 | 450 | 2.4 |
| 33 | 0.05 | 0.20 | 0.75 | 0.10 | 25 | 630 | 380 | 1.9 |
| 34 | 0.05 | 0.20 | 0.75 | 0.20 | 24 | 2,610 | 460 | 1.1 |
| 35 | 0.05 | 0.20 | 0.75 | 0.50 | 22 | 1,970 | 410 | 1.2 |
| 36* | 0.05 | 0.43 | 0.52 | 0.00 | 61 | 95 | 790 | 2.1 |
| 37 | 0.05 | 0.43 | 0.52 | 0.10 | 56 | 280 | 680 | 1.5 |
| 38** | 0.05 | 0.43 | 0.52 | 0.20 | 58 | 890 | 570 | 1.0 |
| 39 | 0.05 | 0.43 | 0.52 | 0.50 | 49 | 2,060 | 400 | 1.0 |
| 40 | 0.05 | 0.43 | 0.52 | 1.0 | 41 | 1,510 | 430 | 1.2 |
| 41 | 0.05 | 0.43 | 0.52 | 2.0 | 30 | 720 | 380 | 1.5 |
| 42 | 0.05 | 0.43 | 0.52 | 3.0 | 24 | 510 | 350 | 2.2 |
| 43* | 0.05 | 0.46 | 0.49 | 0.00 | 71 | 87 | 965 | 3.1 |
| 44 | 0.05 | 0.46 | 0.49 | 0.10 | 63 | 240 | 1,020 | 1.2 |
| 45 | 0.05 | 0.46 | 0.49 | 0.20 | 67 | 1,250 | 705 | 0.9 |
| 46** | 0.05 | 0.46 | 0.49 | 0.30 | 62 | 1,600 | 640 | 0.8 |
| 47 | 0.05 | 0.46 | 0.49 | 0.50 | 56 | 1,890 | 450 | 0.8 |
| 48* | 0.05 | 0.55 | 0.40 | 0.00 | 43 | 130 | 810 | 1.2 |
| 49 | 0.05 | 0.55 | 0.40 | 0.10 | 32 | 560 | 700 | 1.1 |
| 50 | 0.05 | 0.55 | 0.40 | 0.20 | 35 | 620 | 650 | 0.9 |
| 51 | 0.05 | 0.55 | 0.40 | 0.50 | 25 | 3,190 | 540 | 0.9 |
| 52* | 0.02 | 0.47 | 0.51 | 0.00 | 80 | 80 | 1,190 | 1.4 |
| 53 | 0.02 | 0.47 | 0.51 | 0.10 | 49 | 480 | 880 | 1.3 |
| 54** | 0.02 | 0.47 | 0.51 | 0.20 | 52 | 890 | 610 | 1.2 |
| 55 | 0.02 | 0.47 | 0.51 | 0.50 | 63 | 1,260 | 580 | 1.0 |
| 56 | 0.02 | 0.47 | 0.51 | 1.0 | 51 | 800 | 560 | 1.4 |
| 57* | 0.01 | 0.70 | 0.29 | 0.00 | 6 | 210 | 370 | 2.4 |
| 58 | 0.01 | 0.70 | 0.29 | 0.10 | 7 | 630 | 410 | 1.0 |
| 59 | 0.01 | 0.70 | 0.29 | 0.50 | 8 | 1,680 | 360 | 1.0 |
| 60 | 0.01 | 0.70 | 0.29 | 3.0 | 6 | 480 | 340 | 2.2 |
| 61* | 0.01 | 0.09 | 0.90 | 0.00 | 16 | 470 | 270 | 4.4 |
| 62 | 0.01 | 0.09 | 0.90 | 0.10 | 14 | 700 | 250 | 1.2 |
| 63 | 0.01 | 0.09 | 0.90 | 0.50 | 13 | 1,880 | 210 | 1.0 |
| 64 | 0.01 | 0.09 | 0.90 | 3.0 | 10 | 630 | 200 | 3.5 |
| 65* | 0.05 | 0.05 | 0.90 | 0.00 | 9 | 530 | 370 | 2.2 |
| 66 | 0.05 | 0.05 | 0.90 | 0.10 | 8 | 789 | 350 | 1.0 |

TABLE 1—Continued

| Number | Mol ratio of basic composition: Pb(Li1/4 Sb3/4)O3, x | PbTiO3, y | PbZrO3, z | Additive agent, MnO (wt. percent) | $k_r$ (percent) | $Q_m$ | ε | Tan δ (percent) |
|---|---|---|---|---|---|---|---|---|
| 67 | 0.05 | 0.05 | 0.90 | 0.50 | 7 | 1,790 | 320 | 1.1 |
| 68 | 0.05 | 0.05 | 0.90 | 3.0 | 6 | 650 | 300 | 2.1 |
| 69* | 0.30 | 0.05 | 0.65 | 0.00 | 8 | 110 | 450 | 5.6 |
| 70 | 0.30 | 0.05 | 0.65 | 0.10 | 8 | 480 | 410 | 2.0 |
| 71 | 0.30 | 0.05 | 0.65 | 0.50 | 6 | 1,710 | 380 | 1.4 |
| 72 | 0.30 | 0.05 | 0.65 | 3.0 | 5 | 790 | 360 | 3.3 |
| 73* | 0.30 | 0.50 | 0.20 | 0.00 | 10 | 280 | 170 | 3.5 |
| 74 | 0.30 | 0.50 | 0.20 | 0.10 | 12 | 670 | 160 | 2.0 |
| 75 | 0.30 | 0.50 | 0.20 | 0.50 | 12 | 1,760 | 140 | 1.5 |
| 76 | 0.30 | 0.50 | 0.20 | 3.0 | 10 | 800 | 140 | 3.3 |
| 77* | 0.10 | 0.70 | 0.20 | 0.00 | 10 | 410 | 320 | 2.8 |
| 78 | 0.10 | 0.70 | 0.20 | 0.10 | 11 | 930 | 280 | 1.3 |
| 79 | 0.10 | 0.70 | 0.20 | 0.50 | 10 | 2,010 | 260 | 1.1 |
| 80 | 0.10 | 0.70 | 0.20 | 3.0 | 8 | 670 | 250 | 2.5 |

NOTE.—The specimens whose numbers have a solo asterisk (*) are not included within the scope of this invention; in manufacture of the specimens with double asterisks, manganese dioxide ($MnO_2$) is used instead of manganese carbonate ($MnCO_3$) as one of the starting materials.

TABLE 2

| Number | Basic Composition: x | y | z | u | Me | MnO, weight percent | $k_r$ | $Q_m$ | ε | tan δ |
|---|---|---|---|---|---|---|---|---|---|---|
| 1 | 0.02 | 0.45 | 0.53 | 0.05 | Ca | 0.00 | 74 | 90 | 2,280 | 2.6 |
| 2 | 0.02 | 0.45 | 0.53 | 0.05 | Ca | 0.10 | 56 | 430 | 1,580 | 1.5 |
| 3 | 0.02 | 0.45 | 0.53 | 0.05 | Ca | 0.50 | 63 | 1,420 | 1,250 | 1.6 |
| 4 | 0.02 | 0.45 | 0.53 | 0.05 | Ca | 3.0 | 40 | 590 | 930 | 2.4 |
| 5 | 0.02 | 0.42 | 0.56 | 0.10 | Ca | 0.00 | 68 | 75 | 3,020 | 2.7 |
| 6 | 0.02 | 0.42 | 0.56 | 0.10 | Ca | 0.10 | 51 | 390 | 2,660 | 1.3 |
| 7 | 0.02 | 0.42 | 0.56 | 0.10 | Ca | 0.50 | 62 | 1,310 | 2,310 | 1.5 |
| 8 | 0.02 | 0.42 | 0.56 | 0.10 | Ca | 3.0 | 35 | 480 | 2,050 | 2.5 |
| 9 | 0.02 | 0.47 | 0.51 | 0.02 | Sr | 0.00 | 69 | 90 | 1,820 | 2.5 |
| 10 | 0.02 | 0.47 | 0.51 | 0.02 | Sr | 0.10 | 41 | 500 | 1,210 | 1.3 |
| 11 | 0.02 | 0.47 | 0.51 | 0.02 | Sr | 0.50 | 56 | 1,450 | 1,060 | 1.7 |
| 12 | 0.02 | 0.47 | 0.51 | 0.02 | Sr | 3.0 | 33 | 180 | 680 | 2.3 |
| 13 | 0.05 | 0.43 | 0.52 | 0.10 | Sr | 0.00 | 74 | 90 | 2,580 | 3.1 |
| 14 | 0.05 | 0.43 | 0.52 | 0.10 | Sr | 0.10 | 55 | 460 | 2,200 | 1.8 |
| 15 | 0.05 | 0.43 | 0.52 | 0.10 | Sr | 0.50 | 60 | 1,830 | 1,860 | 1.5 |
| 16 | 0.05 | 0.43 | 0.52 | 0.10 | Sr | 3.0 | 35 | 470 | 1,590 | 2.9 |
| 17 | 0.02 | 0.48 | 0.50 | 0.05 | Ba | 0.00 | 73 | 90 | 1,760 | 2.3 |
| 18 | 0.02 | 0.48 | 0.50 | 0.05 | Ba | 0.10 | 51 | 470 | 1,160 | 1.1 |
| 19 | 0.02 | 0.48 | 0.50 | 0.05 | Ba | 0.50 | 62 | 1,940 | 780 | 1.3 |
| 20 | 0.02 | 0.48 | 0.50 | 0.05 | Ba | 3.0 | 40 | 390 | 510 | 2.0 |
| 21 | 0.05 | 0.46 | 0.49 | 0.10 | Ba | 0.00 | 66 | 80 | 2,240 | 2.8 |
| 22 | 0.05 | 0.46 | 0.49 | 0.10 | Ba | 0.10 | 39 | 520 | 1,580 | 1.5 |
| 23 | 0.05 | 0.46 | 0.49 | 0.10 | Ba | 0.50 | 53 | 1,930 | 1,210 | 1.7 |
| 24 | 0.05 | 0.46 | 0.49 | 0.10 | Ba | 3.0 | 31 | 610 | 930 | 2.5 |

Moreover, it has been found that the superior piezoelectric properties as shown and mentioned are available when the basic compositions represented by the formula $$[Pb(Li_{1/4}Sb_{3/4})O_3]x[PbTiO_3]y[PbZrO_3]z$$

where, $x$, $y$ and $z$ represent a set of mol ratios and $x+y+z=1.00$, and lie within the area A–B–C–D–E–F of FIG. 1 of the drawing. The sets of mol ratios $x$, $y$ and $z$ at the vertices of this polygonal area are as follows:

| | x | y | z |
|---|---|---|---|
| A | 0.01 | 0.70 | 0.29 |
| B | 0.01 | 0.09 | 0.90 |
| C | 0.05 | 0.05 | 0.90 |
| D | 0.30 | 0.05 | 0.65 |
| E | 0.30 | 0.50 | 0.20 |
| F | 0.10 | 0.70 | 0.20 |

If the basic compositions do not fall within the above-mentioned area, the resultant ceramics possess rather inferior piezoelectric properties of little use.

Table 2 reveals that excellent piezoelectric properties are possessed by the ceramics in which a part of the Pb of the basic composition is replaced by Ba, Sr, or Ca. In general, at least one or Ca may replace up to 25 atom percent of Pb contained in the basic composition.

It should be noted that the improvement made in the piezoelectric properties by incorporation of MnO clearly results from the presence of manganese ions. There are various known methods for producing manganese ions by using as a starting material manganese oxide itself (such as MnO or $MnO_2$) or some other manganese compound such as $MnCO_3$. The latter is easily decomposed at elevated temperature to form manganese oxide. If a manganese compound other than MnO is utilized, it should be used in an equivalent amount as calculated on the basis of MnO. In the above examples, $MnCO_3$ is mostly used instead of MnO. The use of $MnO_2$ is exemplified in Nos. 10, 38, 46, and 54 of Table 1.

It will be apparent that the starting materials to be used in the manufacture of the ceramics of this invention are not limited to those used in the above examples. It may be observed that those oxides which are easily decomposed at elevated temperature to form the required compositions may be used instead of the starting materials of the above examples, for example $Pb3O_4$ may be substituted for PbO. Also, those salts such as oxalates or carbonates may be used instead of the oxides used in the examples, which such salts being easily decomposed into the respective oxides at elevated temperatures. Otherwise, hydroxides of the same character as above, may be used instead of the oxides. Moreover, an excellent piezoelectric ceramic material having similar properties to the above examples is obtainable by preparing in advance separately the powdered material of each of $$Pb(Li_{1/4}Sb_{3/4})O_3,\ PbTiO_3 \text{ and } PbZrO_3$$

and of any starting material for MnO in advance and by using them as starting materials to be mixed subsequently.

It is usual for zirconium dioxide ($ZrO_2$) available in the market to contain several percent of hafnium dioxide ($HfO_2$). Accordingly, the ceramic compositions of this invention may contain small amounts of oxides or elements existing in materials available in the market.

While there has been described what at present is believed to be the preferred examples of this invention, it will be obvious that various modifications can be made therein without departing from the scope of this invention and that this invention covers all the ceramic compositions as specified in the appended claims.

What we claim is:

1. Piezoelectric ceramics consisting essentially of a solid solution of $Pb(Li_{1/4}Sb_{3/4})O_3$, $PbTiO_3$ and $PbZrO_3$ and manganese oxide in the amount of 0.10 to 3.0 weight percent calculated as MnO, the composition of said solid solution being represented by the formula $$[Pb(Li_{1/4}Sb_{3/4})O_3]x[PbTiO_3]y[PbZrO_3]z$$

where $x$, $y$ and $z$ represent a set of mol ratios and $x+y+z=1.00$, and falling within the polygonal area A–B–C–D–E–F of FIG. 1 of the drawing, the sets of mol ratios $x$, $y$ and $z$ of the vertices of said polygonal area being as follows:

| | x | y | z |
|---|---|---|---|
| A | 0.01 | 0.70 | 0.29 |
| B | 0.01 | 0.09 | 0.90 |
| C | 0.05 | 0.05 | 0.90 |
| D | 0.30 | 0.05 | 0.65 |
| E | 0.30 | 0.50 | 0.20 |
| F | 0.10 | 0.70 | 0.20 |

2. The piezoelectric ceramics claimed in claim 1, in which up to 25 atom percent of Pb in said solid solution is replaced by at least one of Ba, Sr and Ca.

3. The piezoelectric ceramics claimed in claim 1, in which the amount of manganese oxide ranges from 0.10 to 1.0 weight percent calculated as MnO.

References Cited

UNITED STATES PATENTS

| | | | |
|---|---|---|---|
| 3,268,453 | 8/1966 | Ouchi et al. | 252—62.9 |
| 3,372,121 | 3/1968 | Banno | 252—62.9 |
| 3,424,686 | 1/1969 | Ouchi et al. | 252—62.9 |
| 3,463,732 | 8/1969 | Banno et al. | 252—62.9 |

TOBIAS E. LEVOW, Primary Examiner

J. COOPER, Assistant Examiner

U.S. Cl. X.R.

106—39 R